(12) United States Patent
Sansbury et al.

(10) Patent No.: US 6,320,788 B1
(45) Date of Patent: Nov. 20, 2001

(54) PROGRAMMABLE IMPEDANCE DEVICE

(75) Inventors: James D. Sansbury, Portola Valley; Sau C. Wang, Hillsborough, both of CA (US)

(73) Assignee: Sandisk Corporation, Sunnyvale, CA (US)

( * ) Notice: Subject to any disclaimer, the term of this patent is extended or adjusted under 35 U.S.C. 154(b) by 0 days.

(21) Appl. No.: 09/658,963

(22) Filed: Sep. 11, 2000

Related U.S. Application Data

(63) Continuation of application No. 09/159,848, filed on Sep. 25, 1998, now Pat. No. 6,201,734.

(51) Int. Cl.$^7$ .................................................. G11C 16/04
(52) U.S. Cl. ................................. 365/185.1; 365/185.01; 365/185.03; 365/185.08
(58) Field of Search ..................... 365/185.01, 185.05, 365/185.19, 185.1, 185.03, 185.08

(56) References Cited

U.S. PATENT DOCUMENTS

| | | |
|---|---|---|
| 5,247,478 | 9/1993 | Gupta et al. . |
| 5,272,368 | 12/1993 | Turner et al. . |
| 5,412,599 * | 5/1995 | Daniele et al. ............... 365/185.03 |
| 5,581,501 | 12/1996 | Sansbury et al. . |
| 5,581,504 | 12/1996 | Chang . |
| 5,638,320 | 6/1997 | Wong et al. . |
| 5,640,344 * | 6/1997 | Pani et al. ..................... 365/185.01 |
| 5,666,307 | 9/1997 | Chang . |
| 5,687,115 | 11/1997 | Wong et al. . |
| 5,691,939 | 11/1997 | Chang et al. . |
| 5,694,356 | 12/1997 | Wong et al. . |
| 5,706,227 | 1/1998 | Chang . |
| 5,736,764 | 4/1998 | Chang . |
| 5,751,635 | 5/1998 | Wong et al. . |
| 5,764,096 | 6/1998 | Lipp et al. . |
| 5,883,827 | 3/1999 | Morgan . |
| 6,011,742 | 1/2000 | Zheng . |

FOREIGN PATENT DOCUMENTS

WO 94/22142   9/1994   (WO) .

* cited by examiner

*Primary Examiner*—Huan Hoang
(74) *Attorney, Agent, or Firm*—Skjerven Morrill MacPherson LLP

(57) ABSTRACT

A programmable impedance element (204) is implemented using integrated circuit techniques and devices. An impedance of the programmable impedance element is adjusted by appropriately configuring the element. The programmable impedance element has a range of impedance values, and is configurable to be a value within this range. In an embodiment, the programmable impedance element is implemented using a floating gate device (230), and is nonvolatile.

12 Claims, 6 Drawing Sheets

PROGRAMMABLE IMPEDANCE DEVICE

This is a continuation of application Ser. No. 09/159,848, filed Sept. 25, 1998 now U.S. Pat. No. 6,201,734.

BACKGROUND OF THE INVENTION

The present invention relates to the field of integrated circuits, and more specifically to techniques and devices for programmable impedance.

The age of information and electronic commerce has been made possible by the development of semiconductor technology and integrated circuits. Integrated circuits are sometimes referred to as "chips." Integrated circuits have been widely adopted and are used in many products in the areas of computers and other programmed machines, consumer electronics, telecommunications and networking equipment, industrial automation, and medical instruments, just to name a few. Integrated circuits are the foundation of the internet and other on-line technologies including the World Wide Web (WWW).

There is a continuing demand for electronic products that are easier to use, more accessible to greater numbers of users, provide more features, and generally address the needs of consumers and customers. Integrated circuit technology continues to advance rapidly. With new advances in technology, more of these needs are addressed. Furthermore, new advances may also bring about fundamental changes in technology that profoundly impact and greatly enhance the products of the future.

The building blocks of an integrated circuit are electrical and electronic elements. These elements include transistors, diodes, resistors, and capacitors. There may be many numbers of these elements on a single integrated circuit. Improvements in the electrical elements and the development of new types of electrical elements will enhance the performance, functionality, and size of the integrated circuit. As an example, a basic electrical property used in an integrated circuit is resistance (also known as "impedance"). In fact, the operation of every integrated circuit is affected to some extent by on-chip electrical resistance. Resistors and other resistive elements are used in the implementation of many circuits on an integrated circuit.

As can be appreciated, there is a need to provide techniques and devices for implementing a programmable impedance device.

SUMMARY OF THE INVENTION

The present invention provides techniques and devices for implementing a programmable impedance element. An impedance of the programmable impedance element is adjusted by appropriately configuring the element. The programmable impedance element has a range of impedance values, and is configurable to be a value within this range.

In an embodiment, the programmable impedance element: includes a floating gate memory cell and a programmable impedance device. The floating gate memory cell is programmed by hot electrons or Fowler-Nordheim tunneling, which adjusts threshold voltages of the memory cell and the programmable impedance device. The impedance of the programmable impedance device is directly related to a programmed threshold voltage of the floating gate memory cell. The programmable impedance device is nonvolatile, and retains its value indefinitely.

The floating gate memory cell may be an EEPROM or Flash transistor. The memory cell and programmable impedance device may be n-channel or p-channel devices. Furthermore, they may be both the same device type, or different device types. In an implementation, a control gate may be shared between the memory cell and programmable impedance device. In other configurations, there may be two independent control gates. In further configurations, the memory cell may have a control gate, and the resistor element does not have a control gate. A floating gate may be shared between the memory cell and programmable impedance device.

Various techniques may be used to configure the programmable impedance element. For example, the memory cell may be programmed by applying a range of programming voltages VPP to a control gate. Another technique is to apply a varying number of pulses of a particular VPP voltage. These pulses may be applied to the control gate or the bit line of the memory device. Erase by Fowler-Nordheim tunneling can also be used to adjust the threshold voltage.

Another aspect of the present invention is the use of a multilevel memory cell to form a programmable impedance device. The programmable impedance device of the present invention may be coupled in series or parallel, and combinations of these, to form a programmable impedance network.

In another embodiment, the present invention is a circuit including a memory device coupled between a bit line and a source line. A programmable impedance device is coupled to the memory device, where an impedance between a first terminal and a second terminal of the programmable impedance device is configurable to be one of at least three different values depending on a configured state of the memory device. Moreover, a relationship between the level of the programming voltage applied to the memory device during programming and the corresponding programmed threshold voltage of the memory device is approximately linear.

In a further embodiment, the present invention is a programmable impedance element including a memory cell comprising a floating gate, where the memory cell is configurable to have more than two threshold voltages. A programmable impedance device has a floating gate shared with the floating gate of the memory cell, where an impedance of the programmable impedance device is based on a threshold voltage of the memory cell. The threshold voltage of the memory cell may be adjusted by varying a number of pulses of a programming voltage applied at a control gate or bit line of the memory cell. Alternatively, the threshold voltage of the memory cell may be adjusted by varying the magnitude of the programming voltage applied to the control gate of the memory cell.

A still further aspect of the present invention is a method of selecting a value of an impedance on an integrated circuit. A programming voltage is applied to a floating gate memory device. The floating gate memory device is configured to have a programmed threshold voltage that is a value between a first threshold voltage and a second threshold voltage, inclusive. An impedance value is obtained for a programmable impedance device, coupled to the floating gate memory device, based on the threshold voltage of the floating gate memory device.

Other objects, features, and advantages of the present invention will become apparent upon consideration of the following detailed description and the accompanying drawings, in which like reference designations represent like features throughout the figures.

DESCRIPTION OF THE SPECIFIC EMBODIMENTS

Figure 1:
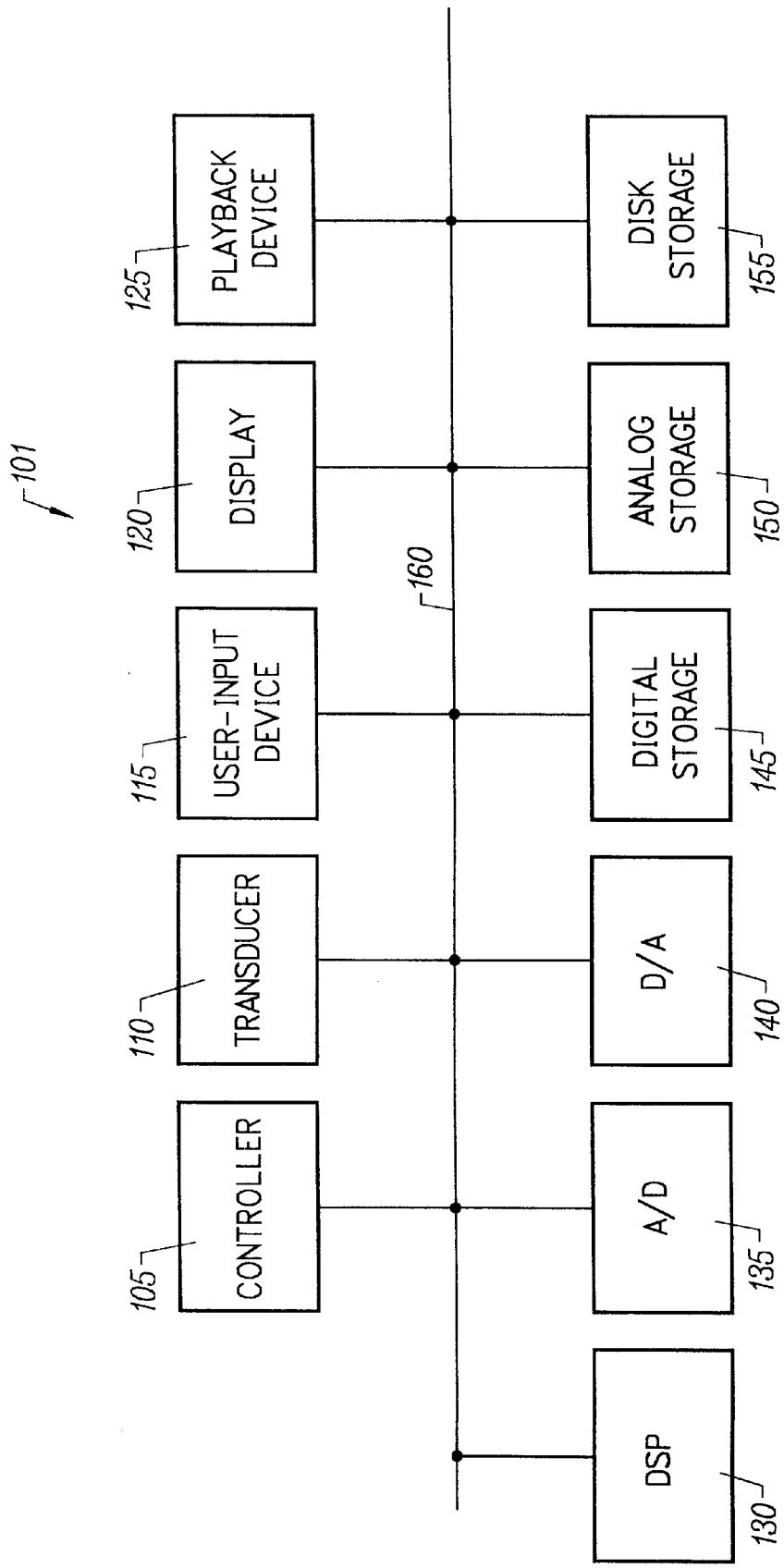
FIG. 1 shows an electronic system.

The present invention may be used in the implementation of electronic devices and systems such as shown. in FIG. 1. FIG. 1 shows an electronic system 101 with a controller 105, transducer 110, user-input device 115, display 120, playback device 125, digital signal processor (DSP) 130, analog-to-digital converter 135, digital-to-analog converter 140, digital storage 145, analog storage 150, and disk storage 155. These components may all be present in the same electronic system. Alternatively, an electronic system may contain any combination of the components shown. For example, an electronic system such as a computer may include a controller (e.g., microprocessor, computer motherboard), display, disk storage, display, and user-input device. The components of the electronic system are coupled together using interconnection facility 160. Examples of an interconnection facility include a wire, system bus, network, the internet, and others.

An example of an integrated circuit where the present invention may be used is described in U.S. provisional patent application No. 60/091,326, filed Jun. 30, 1998, incorporated herein by reference in its entirety for all purposes.

Figure 2A:
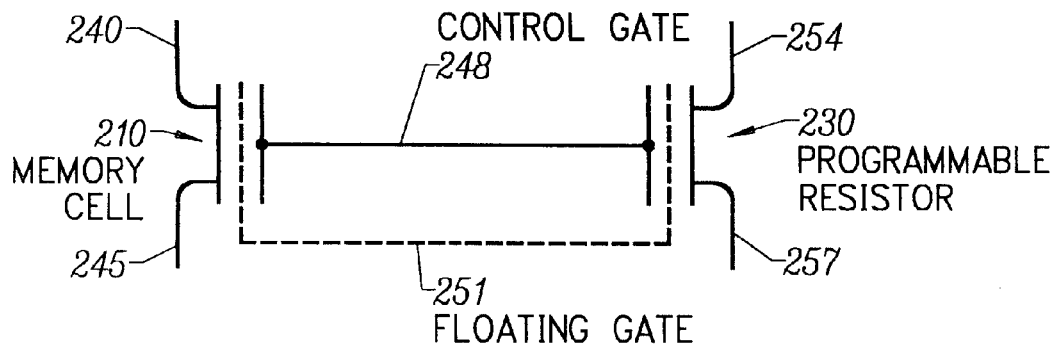
FIG. 2A shows a programmable impedance element with control gates coupled together.

FIG. 2A shows an embodiment of a single programmable impedance element 204 of the present invention. FIG. 2A shows a memory cell 210 and programmable impedance device 230. Memory cell 210 has a bit line (BL) 240, source line (SL) 245, control gate (CG) 248, and floating gate (FG) 251.

Memory cell 210 may be implemented using a floating gate transistor such as an EPROM cell, EEPROM cell, or Flash cell. Memory cell 210 may be an n-channel or NMOS device. Memory cell 210 may be a p-channel or PMOS device. Furthermore, memory cell 210 may be an analog memory cell or a. multilevel memory cell. The memory cell may be referred to as an "analog" memory cell since the memory cell can store a relatively large range of analog values. For example, the memory cell may be programmed to have a plurality of threshold voltage (VT) levels. These analog values may have discrete steps such as, for example, 10-millivolt steps. In other embodiments, the analog values may be continuous. Although a memory cell may store an analog value (or digital value), a degree of precision for such a memory cell may be quantified by the number of discrete steps the memory cell can store. Higher resolutions may be limited by the electron's charge, leakage to and from the storage device, and accuracy due to other circuitry.

In a relatively basic embodiment of the present invention, a memory cell will be configurable to have at least three different threshold voltage levels. In further embodiments of the present invention, the memory cell is configurable to be one of more than two threshold voltages, where the greater number of possible threshold voltages permits a more flexible programmable impedance device. Taking into consideration current technology, memory cells having 4, 8, 16 and 24 different threshold voltage levels are easily implemented. Moreover, memory cells storing $2^8$ or 256 levels are practical, and may be implemented using circuitry such as described in U.S. provisional patent application No. 60/091,326 and U.S. Pat. No. 5,694,356, which are incorporated herein by reference in its entirety for all purposes. Circuitry and techniques other than those described in U.S. provisional application No. 60/091,326 and U.S. Pat. No. 5,694,356 may also be used to permit such multilevel storage. Other embodiments of the present invention may have even greater numbers of levels, especially taking into consideration the relatively rapid advances in technology.

Programmable impedance device 230 has a first terminal 254 and second terminal 257. Programmable impedance device 230 shares control gate 248 and floating gate 251 with memory cell 210. In other implementations, the programmable impedance device may have a separate control gate from the memory cell. By providing a separate control gate for the programmable impedance device, this permits additional flexibility in the configuration and operation of the device. For example, during normal operation, a bias voltage may be provided to the programmable impedance device to adjust its value, without similarly affecting the memory cell.

The programmable impedance device may be referred to as a "programmable resistor," although this device is not necessarily implemented using a resistor. In fact, in a specific embodiment, programmable impedance device 230 is implemented using a transistor where there is a resistance or impedance between terminals 254 and 257. Programmable impedance device 230 may be implemented using an n-channel or p-channel transistor structure. Alternatively, programmable impedance device 230 may be a floating gate transistor such as an EPROM cell, EEPROM cell, or Flash cell.

The programmable impedance device will be configurable to have one of a plurality of impedance values. The impedance of programmable impedance device 230 is based on a programmed state of memory cell 210. Consequently, programmable impedance device 230 may have as many possible, different values as memory cell 210 has different threshold voltage levels. For example, if the memory cell has 256 levels, the programmable impedance device can be expected to have at most 256 different impedance values.

Figure 2B:
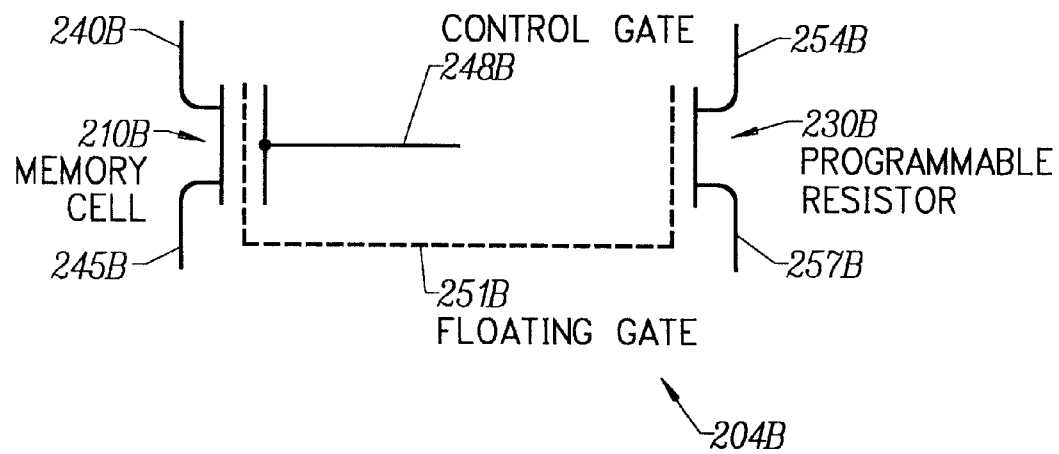
FIG. 2B shows a programmable impedance element having one control gate.
Figure 2C:
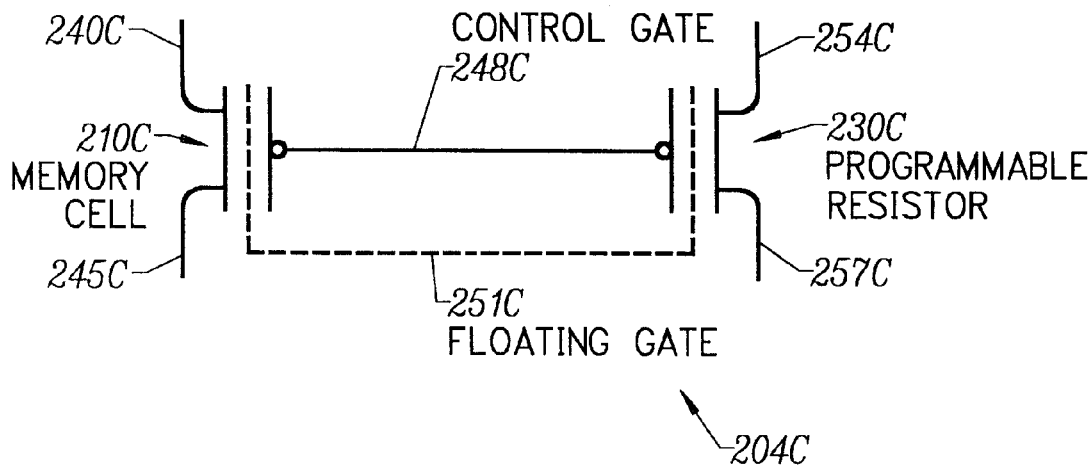
FIG. 2C shows a programmable impedance element implemented using p-channel devices with control gates coupled together.
Figure 2D:
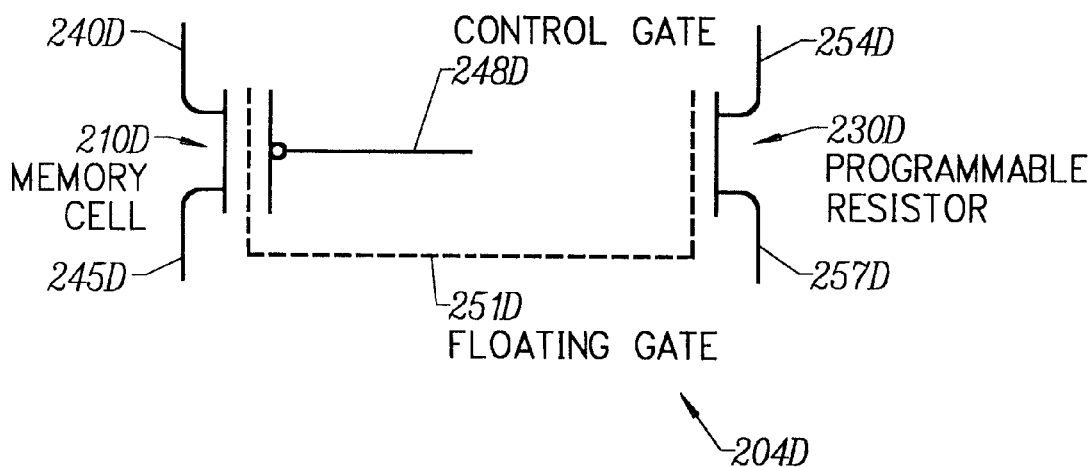
FIG. 2D shows a programmable impedance element implemented using p-channel devices having one control gate.

FIGS. 2B, 2C, and 2D show further embodiments of the present invention. FIG. 2B shows a programmable impedance element 204B where programmable impedance device 230B does not have a control gate. The programmable impedance element in FIG. 2B is operationally similar to that in FIG. 2A. The control gate for memory cell 210B allows configuring of floating gate 251B, which is shared between memory cell 210B and programmable impedance device 230B. Reference numbers 204–254B in FIG. 2B correspond to like features with reference numbers 204–254 in FIG. 2A.

FIG. 2C shows an embodiment of the present invention where both memory cell 210C and programmable impedance device 230C are p-channel devices. Operationally, taking into consideration the differences between p-channel and n-channel devices, programmable impedance element 204C operates similarly to programmable impedance element 204 (in FIG. 2A). Reference numbers 204C–254C in FIG. 2C correspond to like features with reference numbers 204–254 in FIG. 2A. In this embodiment, memory cell 210C and programmable impedance device 230C have control gates coupled together, similar to the configuration in FIG. 2A.

FIG. 2D shows an embodiment of the present invention where both memory cell 210D and programmable impedance device 230D are p-channel devices. Operationally, taking into consideration the differences between p-channel and n-channel devices, programmable impedance element 204D operates similarly to programmable impedance element 204 (in FIG. 2A) and in particular, programmable impedance element 204B (in FIG. 2B). Reference numbers 204D–254D in FIG. 2D correspond to like features with reference numbers 204–254 in FIG. 2A. In this embodiment, memory cell 210D has a control gate, and programmable impedance device 230D does not have a control gate.

Other embodiments of the present invention include implementations where the memory cell 210 and programmable impedance device 230 are different device types. For example, memory cell 210 is NMOS while programmable impedance device 230 is PMOS, or vice versa.

A number of programmable impedance elements 204 may be arranged in various structure and organizations on an integrated circuit. For example, the programmable impedance element may be organized in arrays of rows and columns. Some implementations of these arrays of programmable impedance elements may be relatively small in size to facilitate ease of making interconnections from the resistors. For example, the array size may be 2×2, 3×3, 2×3, or 3×4, as well as other dimensions.

Figure 3:
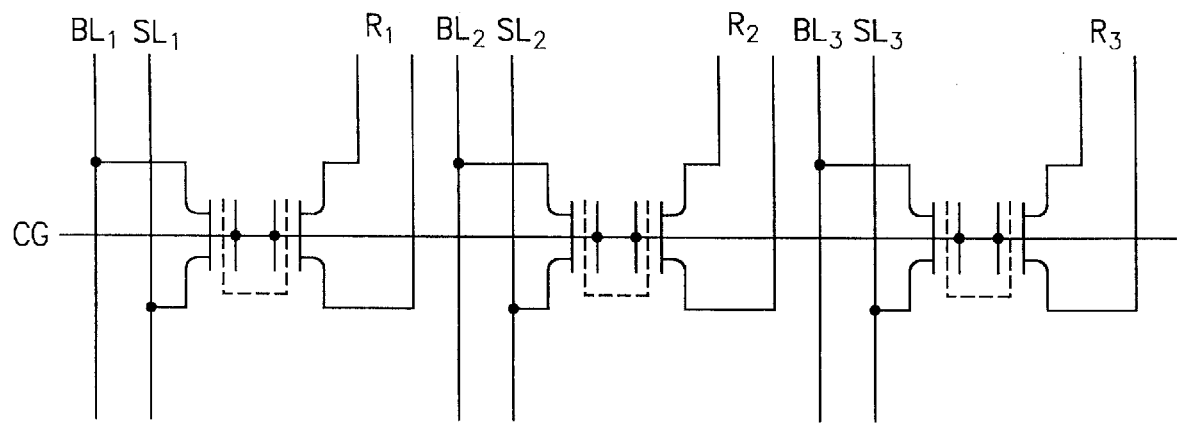
FIG. 3 shows a simplified layout of a row configuration of programmable impedance elements.

The programmable impedance element may be implemented in a single row configuration or a single column configuration. FIG. 3 shows a simplified layout for a row of three programmable impedance elements. There are three BL lines and SL lines, and three resistances $R_1$, $R_2$, and $R_3$. The programmable impedance elements share a common CG line. The resistances $R_1$, $R_2$, and $R_3$ may be programmed independently of each other.

Figure 4:
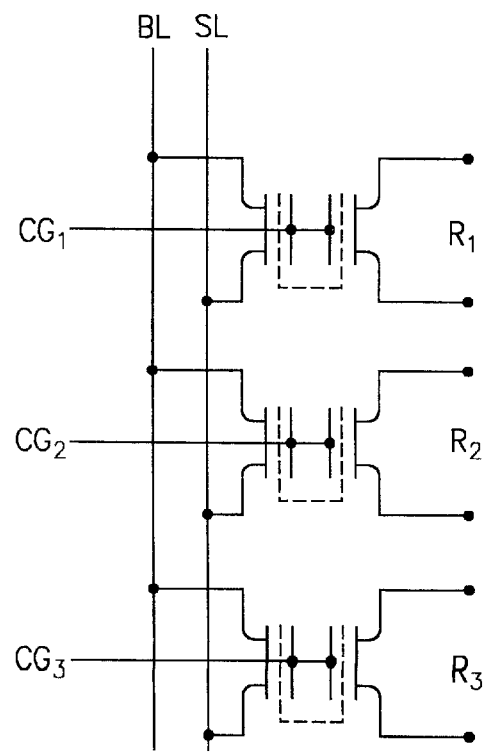
FIG. 4 shows a simplified layout of a column configuration of programmable impedance elements.

FIG. 4 shows a simplified layout for a column of three programmable impedance elements. There are three control gate lines, $CG_1$, $CG_2$, and $CG_3$. Each control gate line is associated with a respective resistance, $R_1$, $R_2$, or $R_3$. The column of programmable impedance elements shares common BL and SL lines.

FIGS. 3 and 4 show implementations using the programmable impedance element of FIG. 2A. However, other implementations of the layout in FIGS. 3 and 4 may also use the programmable impedance elements of FIGS. 2B, 2C, or 2D, and combinations of these various programmable impedance elements.

A row or column of impedance elements may be implemented as a row or column in an array of other devices (e.g., other than programmable impedance elements of the present invention). For example, in an array of EEPROM or Flash cells, there may be a row or column of programmable impedance elements integrated with the EEPROM or Flash array. This row or column may be in the interior or at an edge of the EEPROM or Flash array.

Figure 5:
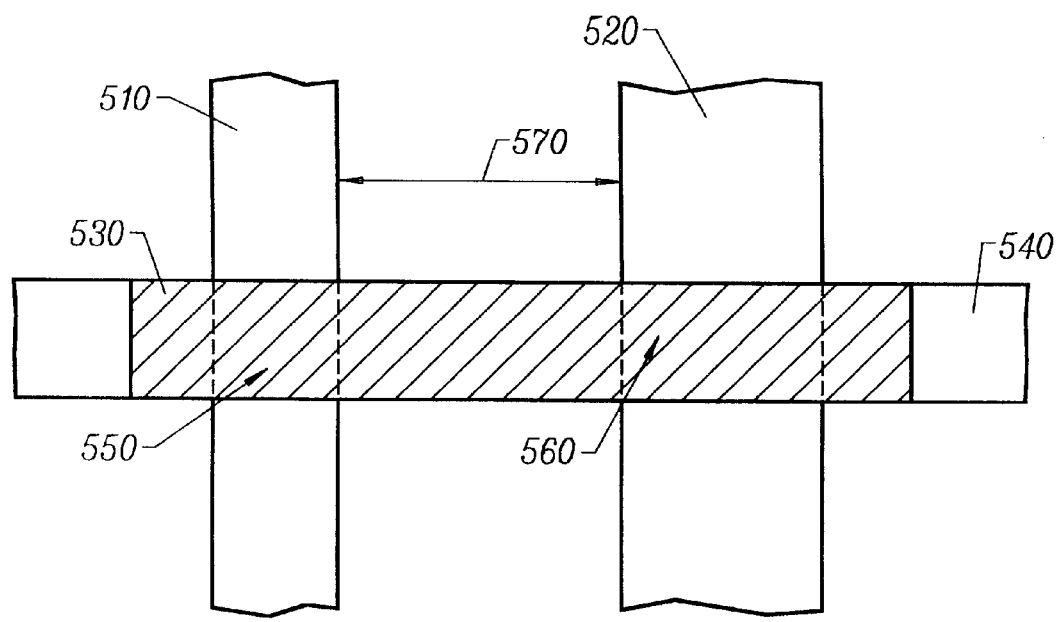
FIG. 5 shows a layout of a programmable impedance element.

FIG. 5 shows an example of a layout of a programmable impedance element of FIG. 2. There is a first diffusion region 510 and second diffusion region 520. A floating gate 530 traverses both the first and second diffusion regions. A control gate 540 runs on top of the floating gate (forming sort of a "sandwich" structure). A memory cell transistor (e.g., memory cell transistor 210 of FIG. 2) is formed by an intersection 550 of the control gate and the first diffusion. A programmable impedance device (e.g., programmable impedance device 230 of FIG. 2) is formed by an intersection 560 of the control gate and the second diffusion.

Variations in the layout may be used to adjust the resistance of the programmable impedance device. For example, the width of diffusion 520 may be adjusted to vary the resistance of the programmable impedance device. For example, as diffusion 520 becomes wider, the resistance will decrease. Also, as the widths of control gate 540 and floating gate 530 increase, the resistance of the programmable impedance device will increase.

Furthermore, other dimension of the layout may be varied. For example, a distance 570 between the two diffusion regions may be extended to any length as needed, without affecting the operation of the programmable impedance element. The length may be 2 microns, 3 microns, 5 microns, 8 microns, 10 microns, 15 microns, or other lengths including those greater than 15 microns. It may be desirable to separate the memory cell from the programmable impedance device which may be placed closer to circuitry making use of the device's impedance. The layout space required for the programmable resistance may be the same or nearly the same space for resistors varying over the wide impedance range of the programmable impedance element.

There are various embodiments of the programmable impedance element of the present invention. In one embodiment of FIG. 2, both memory cell 210 and programmable impedance device 230 are n-channel type devices. Memory cell 210 is a floating gate device where its VT may be adjusted by programming and erase. Programming adds electrons to the floating gate, while erase removes electrons from the floating gate. Programming may be by channel hot-electron injection, Fowler-Nordheim tunneling, or other mechanisms. Erase may be by Fowler-Nordheim tunneling, exposure to ultraviolet light, or other mechanisms.

As electrons are added to the floating gate through programming, the VT of memory cell 210 becomes higher. For example, the VT of the device may range from zero volts (or a negative VT) to six volts or more. As electrons are removed from the floating gate through erase, the VT of the memory cell becomes lower. Memory cell 210 is nonvolatile, which means it retains its programmed state, even when power is removed from the circuitry.

As the degree of programming of floating gate 251 is varied (by altering the number of the electrons on the floating gate), the impedance of programmable impedance device 230 also varies. In particular, the programming of memory cell 210 also alters the VT of programmable impedance device 230. Depending on its VT, the programmable impedance device will have a particular impedance or resistance. Programmable impedance element 204 implements a controllable, programmable impedance that is variable by programming and erase. Once programmed, programmable impedance element 204 maintains its impedance indefinitely. A programmed state of programmable impedance element 204 will also be nonvolatile.

A description of programming and erase circuitry that may be used with the programmable impedance element of the present invention may be found in U.S. Pat. No. 5,694,356.

Memory cell 210 may be programmed by hot electrons as follows. A VPP voltage is placed on CG 248 and a VPD voltage is placed at BL 240. SL 245 will be grounded. The VPP voltage may be in a range from about 8 volts to about 12 volts, and the VPD voltage may be in a range from about 4 volts to about 7 volts. Under such circumstances, a programming current will flow from BL 240 to SL 245. This programming current causes hot electrons. Some of the hot electrons jump a dielectric barrier (between the channel and floating gate), and become trapped in the floating gate. The number of electrons trapped in the floating gate determines the degree to which memory cell 210 and programmable impedance is device 230 are programmed. Consequently, the VTs of these devices will be adjusted. After programming is completed, the programmable impedance device will have the desired or target impedance selected by the programming conditions.

One programming approach is to vary the programmed impedance by varying a magnitude of the VPP voltage applied to CG. For example, table A below provides a listing of VPP voltage applied to CG (i.e., column labeled "Voltage Applied to CG"), the resulting VT voltage of programmable impedance device 230 (i.e., column labeled "VT (result)"), and the corresponding impedance. The voltages given in table A are approximate values, and are provided to illustrate the general. relationship between the voltages and resulting programmed impedance. The precise voltages are technology and application dependent. For example, a "window" of the impedance may be changed by adjusting an implant used on the programmable impedance device, or by changing the bias voltage applied to the CG during normal operation.

TABLE A

| Voltage Applied to CG | VT (result) | Impedance |
|---|---|---|
| 8 | 2 | $5 \times 10^3$ |
| 10 | 4 | $1 \times 10^4$ |
| 12 | 6 | $5 \times 10^4$ |

The VPD voltage applied to BL will typically be from about 4 volts to about 7 volts. There is a relationship between the VPD voltage and the resulting VT and programmed impedance; however this is a relatively weak relationship, especially in comparison to the VCG voltage relationship. Generally, there is relatively poor control of the VT and impedance by using the VPD voltage. As a consequence, it is generally desirable to select a VPD voltage that is lower as this tends to reduce any disturb problems. Disturb problems include the altering of a stored state of a programmable impedance device other than the programmable impedance device intended to be programmed. It is expected as technology improves, the required VPD (to generate the programming current) may even become lower than 4 volts.

The programming time is the time the voltage conditions are applied to the appropriate nodes. For the above approach, the programming time is approximately the same. In other words, the programming voltages are applied for a certain amount of time, and this time is approximately the same regardless of the applied voltages. For example, the programming pulse width of VPP may be 20 microseconds. A range for the programming time may be anywhere from less than 1 microsecond to 10 milliseconds, or even more.

Figure 6:
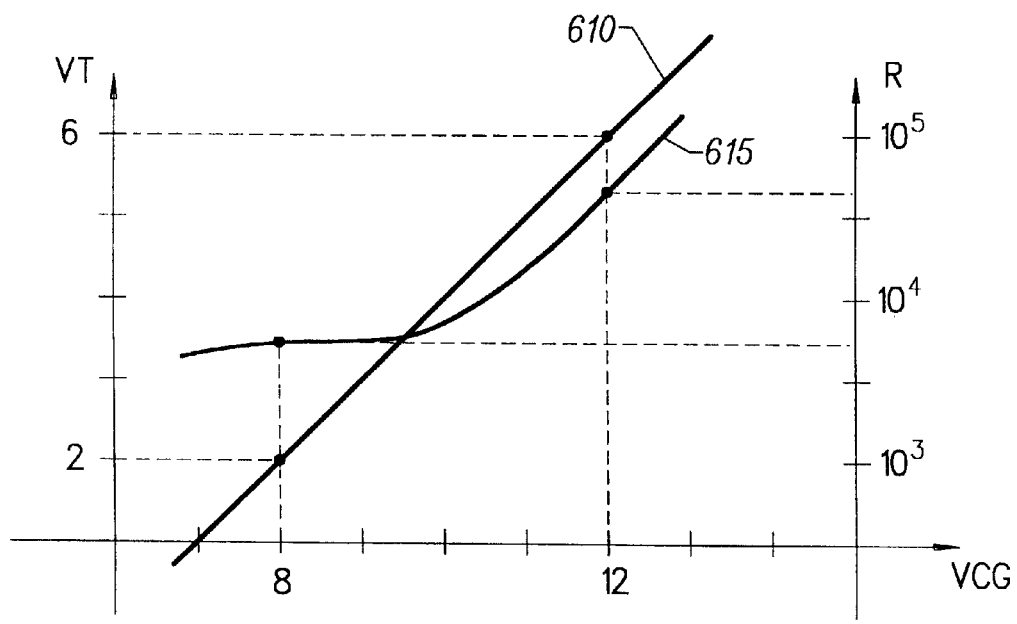
FIG. 6 shows a graph of the relationships between threshold voltage and resistance and the applied control gate.

The relationship between VCG voltage and VT is approximately a linear relationship. FIG. 6 shows a diagram of the VCG versus VT relationship (indicated by line 610). The relationship between VCG and VT may be given approximately by the equation $VT=(k*VCG)-C$, where k is a scaling factor and C is a constant defined by the process technology. In the specific embodiment described in table A and FIG. 6, k is 1 and C is 6, so $VT=CG-6$.

The relationship between VCG and the logarithm of the programmed impedance or R will in general not be a linear relationship. This relationship is shown by curve 615 of FIG. 6. However, the relationship between VCG and impedance may be approximately linear for a limited range of impedances. Good control can be obtained over the programmed impedance R over more than an order of magnitude of impedance range.

Other techniques may be used to program the programmable impedance element of the present invention. The techniques generally involve applying voltages to CG in a way to obtain the desired target VT of the programmable impedance device. For example, a constant VPP voltage may be applied to CG or BL. Programming pulses of this VPP voltage of a certain duration are used. By controlling the number of pulses on CG, this will determine the degree to which the memory cell is programmed (and correspondingly, the VT of the programmable impedance device).

For example, a relationship between the resulting programmed VT and number of programming voltage pulses may be defined by $VT=VT0+n*I$. VT is the resulting programmed threshold voltage; VT0 is the threshold voltage of an unprogrammed or erased memory cell; n is the number of pulses; and I is a voltage increment factor. The value of I will depend on the magnitude of the programming voltage and the width of the programming pulse. For example, if I is 0.10 volts and VT0 is 0 volts, 6 programming pulses would result in a programmed threshold voltage of 0.60 volts.

A further technique for programming the programmable impedance element may be to ramp the CG voltage during programming until the desired VT is obtained.

Erase of the programmable impedance element is accomplished using Fowler-Nordheim tunneling. A VEE voltage is in a range from about 8 volts to about 12 volts, and is a voltage applied to SL for erase. VEE is applied to SL, CG is grounded, and BL may be floating or ground. Under these conditions, electrons are attracted from the floating gate into a source of the memory cell. The programmable impedance element will be erased, and have a minimum resistance value for this element.

Furthermore, the erase mechanism may also be used to obtain the desired VT. For example, the amount of erasure of the programmable impedance element may be controlled by the time the VEE voltage is applied to SL. Very precise resistances may be obtained by a series of programming and erase operations on the programmable impedance element until the desired resistance is obtained. For example, a binary-search-type algorithm may be used to rapidly converge to the target resistance.

To use a programmed impedance of FIGS. 2A–2D after programming, the impedance or resistance is coupled to by using terminals 254 and 257. A bias voltage may be applied to the control gate. Memory cell 210 is not used. BL 240 and SL 245 may be grounded or set at another voltage.

In another embodiment of the present invention, memory cell is 210 is an n-channel device and programmable impedance device 230 is a p-channel device. A floating gate is shared between the n-channel device and the p-channel device. The p-channel device will be formed in an n-well. The operation of this programmable impedance element is similar to what has been described above.

As the floating-gate becomes charged more negatively by electrons, there becomes effectively a negative floating gate voltage (VFG) on the floating gate where there is no control gate bias voltage. In contrast to the case of an n-channel device, for a p-channel device, a negative VFG turns this device on. And as VFG becomes more negative, the p-channel device will be turned on even stronger. Therefore, the impedance becomes less as VFG becomes more negative. Hence, for this embodiment, a slope of the relation between VCG and impedance will be negative. In comparison, the relationship between programmed R and VCG in FIG. 6 has a positive slope.

In a further embodiment of the present invention, both memory cell 210 and programmable impedance device 230 are n-channel devices. A threshold voltage (VT) of programmable impedance device 230 may be adjusted (or not adjusted) by the use of an n-type channel doping. The n-channel doping may be implanted into the channel by ion implantation. After adjusting the VT, programmable impedance device 230 may be a depletion device or normally "on" type device. In such an embodiment, maximum conduction is obtained with an unprogrammed memory cell (e.g., VFG of approximately 0 volts). In such a case, more negative floating gate voltages will result in greater impedance.

In another embodiment, the programmable impedance device is an enhancement type n-channel structure that is a Flash or EEPROM transistor itself. In such a case, the programmable impedance device may have its own control gate, separate from a control gate of the memory cell. There would be two control gates in such an embodiment, and two control gates would allow separate control for programming and normal operation of the memory cell and programmable impedance devices. For example, during normal operation, the memory cell may be biased independently from the programmable impedance device; this may allow both devices to be used for independent purposes during normal operation.

Figure 7:
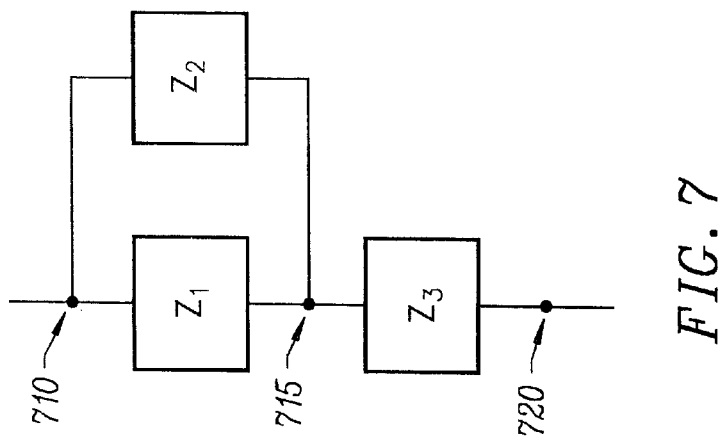
FIG. 7 shows a programmable impedance network having series and parallel combinations of elements.

FIG. 7 shows a diagram of how multiple programmable impedance elements of the present invention may be combined to create a larger programmable impedance structure having a greater range of impedance values. FIG. 7 shows programmable impedance elements $Z_1$, $Z_2$, and $Z_3$. Each of these may be implemented using an element such as shown in FIG. 2. Elements $Z_1$ and $Z_2$ are connected in parallel between nodes 701 and 715. Element $Z_3$ is connected in series with the parallel $Z_1$ and $Z_2$ elements.

By Kirchhoff's laws, an impedance between nodes 710 and 715 is given by $(Z_1*Z_2/(Z_1+Z_2))$. Further programmable impedance elements may be added in parallel, and the resulting impedance is similarly calculated. Therefore, the impedance between nodes 710 and 715 may be programmable based on the combination of two programmable impedance elements of the present invention.

An impedance between nodes 710 and 720 is given by $((Z_1*Z_2/(Z_1+Z_2))+Z_3)$. Additional programmable impedance elements may be added in series, and resulting impedance is similarly calculated. The impedance or resistance between nodes 710 and 720 may be "trimmed" or adjusted by varying programming the individual programmable impedance elements.

There are many uses for a programmable impedance or resistance on an integrated circuit. For example, many integrated circuits include resistor networks that may be trimmed by selectively connecting metal links. However, these types of resistor networks generally do not allow changes to be made to the resistance value after the resistance value has been set. The programmable impedance of the present invention allows adjustments to be made, until an appropriate value is determined. As a further application, the programmable impedance elements of the present invention may be used to implement a programmable delay line, where the delay is varied depending on the impedance. For example, an RC network may be used as a delay network. Variations in impedance will change the delay through the RC network.

Figure 8:
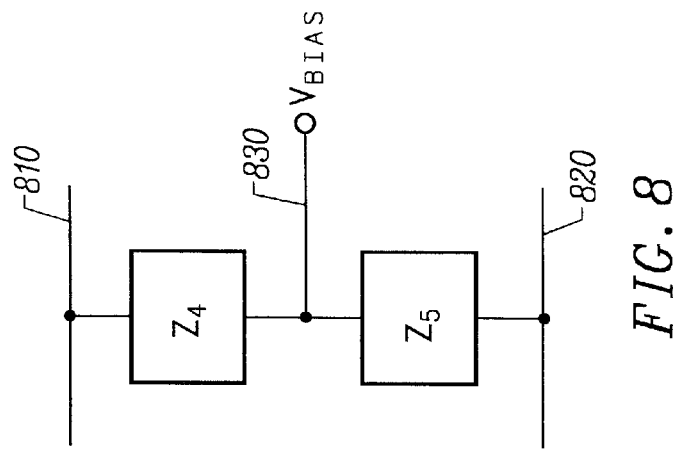
FIG. 8 shows a bias voltage generator implemented using programmable impedance elements.

Moreover, programmable impedances are important in implementing on-chip bias voltage generators. For example FIG. 8 shows programmable impedance elements $Z_4$ and $Z_5$ connected in series between two voltage supply rails 810 and 820. For example, voltage supply 810 may be VDD and voltage supply 820 may be ground or VSS. The programmable voltage elements are used to generate a bias voltage VBIAS at a node 830. The value of VBIAS will be $((V_{810}-V_{820})*Z_5/(Z_4+Z_5))$. $V_{810}$ and $V_{820}$ are the voltages at supply rails 810 and 820, respectively. Therefore, VBIAS may be adjusted to be a desired voltage by appropriately programming programmable impedances $Z_4$ and $Z_5$. Programmable impedance elements may also be added in parallel to $Z_4$ or $Z_5$, or both, to add additional flexibility in the adjustment of VBIAS.

Figure 9:
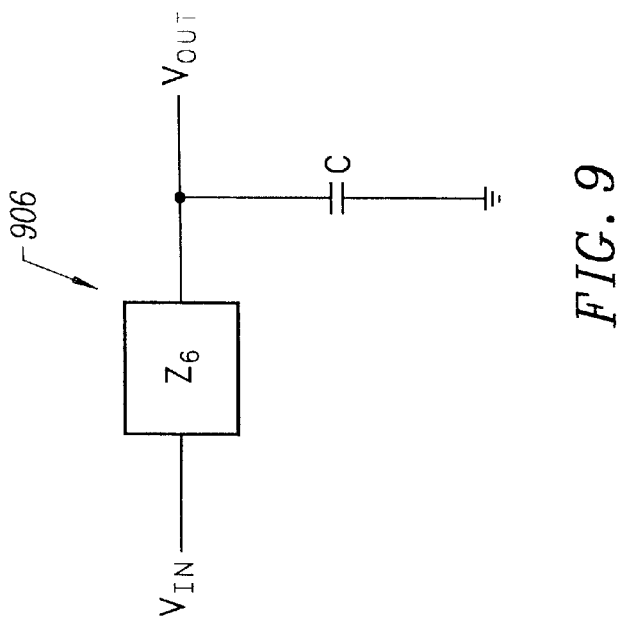
FIG. 9 shows a delay element having a programmable delay.

FIG. 9 shows an example of a delay element 906 for a programmable delay line. There is a programmable impedance element 26 and capacitor C. An input signal is input at $V_{IN}$ and a resulting delayed input signal is output at $V_{OUT}$. The RC delay between $V_{IN}$ and $V_{OUT}$ nodes will be about $Z_6*C$. $Z_6$ is a programmable impedance element as discussed above, and examples of some specific implementations are shown in FIGS. 2A, 2B, 2C, and 2D. $Z_6$ is a programmable impedance that is configurable to have an impedance value that will give the desired RC delay.

$Z_6$ is a nonvolatile resistor. This allows retention of a previously stored RC delay value, even if power is removed from the integrated circuit. Upon power up of the integrated circuit, delay element 906 will provide its configured delay.

C is a capacitor, and may be implemented using any of the methods commonly used to form capacitors in an integrated circuit. For example, C may be purely a parasitic capacitance or intentional capacitance, or a combination of the two. In a specific implementation, C is formed using a transistor.

Additional delay elements 906 may be chained together to create a longer time delay chain.

This description of specific embodiments of the invention is presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications, thus enabling others skilled in the art to utilize and practice the invention in various embodiments and with various modifications as are suited to the particular use contemplated. It is intended that the scope of the invention be defined by the following claims.

What is claimed is:

1. A circuit comprising:
    a first impedance device connected between a first voltage level and a node;
    a second impedance device connected between the node and a second voltage level, wherein one of the impedance devices comprises a non-volatile programmable impedance element having an impedance value selectable by configuring a floating gate.

2. The circuit of claim 1, wherein the non-volatile programmable impedance element comprises:
    a memory cell comprising the floating gate, wherein the memory cell is configurable to have more than two threshold voltages; and
    a programmable impedance device sharing the floating gate, wherein the impedance value is based on a threshold value of the memory cell.

3. The circuit of claim 2, wherein threshold voltages of the memory cell is adjusted by a number of pulses of a programming voltage applied at a control gate of the memory cell.

4. The circuit of claim 1, wherein the circuit is a voltage bias generator, the bias voltage value being supplied at the node.

5. A method of providing a delay, comprising:
    applying a programming voltage to a floating gate memory device;
    configuring the floating gate memory device to have a programmed threshold voltage that is a value between a first threshold value and a second threshold voltage, inclusive; and
    obtaining an impedance value for a delay network, coupled to the floating gate memory device, based on the threshold voltage of the floating gate memory device, wherein the delay network comprises:
        a nonvolatile programmable impedance element coupled between an input node and an output node and having said impedance value; and
        a capacitance coupled between the output node and a reference potential, wherein the circuit provides the delay based said impedance value.

6. The method of claim 5, wherein the capacitor is implemented using parasitic capacitance.

7. The method of claim 5, wherein a floating gate is shared between the floating gate memory device and the impedance element.

8. A programmable impedance element comprising:
    a memory cell comprising a floating gate and a control gate configurable to have a plurality of threshold voltages; and
    a programmable impedance device comprising a control gate and sharing the floating gate, wherein an impedance of the programmable impedance device is based on a threshold value of the memory cell.

9. The programmable impedance element of claim 8, wherein the floating gate of the memory cell and the floating gate of the programmable impedance device are connected.

10. The programmable impedance element of claim 8, wherein the floating gate of the memory cell and the floating gate of the programmable impedance device are independent.

11. The programmable impedance element of claim 8, wherein the floating gate of the memory cell is adjusted by a number of pulses of a programming voltage at a control gate of the memory cell.

12. The programmable impedance element of claim 8, wherein the floating gate of the memory cell is adjusted by a series of programming and erase operations using a binary-search-type algorithm.

* * * * *